United States Patent
Wang et al.

(10) Patent No.: US 7,728,750 B2
(45) Date of Patent: Jun. 1, 2010

(54) DISPLAY PANEL DRIVER

(75) Inventors: Yuh-Diahn Wang, Hsinchu (TW); Yan-Kai Huang, Hsinchu (TW)

(73) Assignee: Holtek Semiconductor, Inc., Hsinchu (TW)

( * ) Notice: Subject to any disclaimer, the term of this patent is extended or adjusted under 35 U.S.C. 154(b) by 3 days.

(21) Appl. No.: 12/203,501

(22) Filed: Sep. 3, 2008

(65) Prior Publication Data

US 2009/0303095 A1 Dec. 10, 2009

(30) Foreign Application Priority Data

Jun. 6, 2008 (TW) ............................. 97121316 A

(51) Int. Cl.
*H03M 1/80* (2006.01)
(52) U.S. Cl. ...................................... 341/153; 341/144

(58) Field of Classification Search ................. 341/135, 341/144, 153; 345/89; 348/572; 315/169.1
See application file for complete search history.

(56) References Cited

U.S. PATENT DOCUMENTS 7,015,647 B2 * 3/2006 Maede et al. ............ 315/169.3
7,456,767 B2 * 11/2008 Abe et al. .................... 341/135

* cited by examiner

*Primary Examiner*—Brian Young
(74) *Attorney, Agent, or Firm*—Volpe and Koenig, P.C.

(57) ABSTRACT

A display panel driver including a binary-weighted current-type D/A converter and a source follower with current mirror is provided. The binary-weighted current-type D/A converter receives n input signals and sends a D/A output voltage signal based on $2^n-1$ times a reference current. The source follower with current mirror receives the D/A output voltage signal and sends $2^n-1$ times the reference current to the output of the source follower with current mirror, so as to output a output voltage and drive the display panel.

4 Claims, 6 Drawing Sheets

3

DISPLAY PANEL DRIVER

FIELD OF THE INVENTION

The present invention relates to a driver, and more particularly to a driver for a display panel.

BACKGROUND OF THE INVENTION

Please refer to FIG. 1, which is a circuit diagram showing a conventional display panel driver according to the prior art. In FIG. 1, the display panel driver 1 includes a digital/analog converter and a gain stage. The digital/analog converter is a 6-bit digital/analog converter 10 and the gain stage is an OP AMP 11. A digital/analog output signal outputted from the 6-bit digital/analog converter 10 is amplified by the OP AMP 11 to become an output voltage signal so as to drive a display panel 12.

The display panel driver shown in FIG. 1 has at least the following two drawbacks:

(1) Bad Linearity

The source voltage VDD used by the system is generally 3.3~5 volt. The digital/analog converter 10 is a low-voltage element and the OP AMP 11 is a high-voltage element. Since the smallest least significant bit (LSB) of the digital/analog converter 10 is $VDD/2^6$, the largest LSB is 78.125 mV. However, the smallest common mode input voltage of the OP AMP 11 is usually over 1 V. The difference makes the range of the common mode input voltage become small. Therefore, a higher input voltage is needed to make the transistors in the OP AMP 11 be operated in saturation region. Please refer to FIG. 2, which is a curve diagram showing the sum of the output of the digital/analog converter and the outputs of the gain stage relating to the input code, wherein the longitudinal coordinate axis represents the sum of the output of the digital/analog converter and the output of the gain stage (unit: volt) and the abscissa axis represents the input code (unit: LSB). It is clear from FIG. 2 that nearly a quarter of the input codes have worse linearity, especially those in the range of the small voltages.

(2) Large Chip Size

Since the OP AMP 11 is a high-voltage element and has a large rule, every channel needs a digital/analog converter and a buffer. Therefore, the chip size gets large.

For the above problems, it is clear that the performance of the conventional display panel driver fails to meet the needs of the users.

SUMMARY OF THE INVENTION

It is therefore an object of the present invention to provide a display panel driver using less high-voltage elements with a better linearity so as to reduce the chip size.

According to the foregoing object of the present invention, a display panel driver is provided. The display panel driver includes a binary-weighted current-type digital/analog converter receiving n input signals and outputting a digital/analog output voltage signal based on $(2^n-1)$ times of a reference current; and a current-mirror-type source follower receiving the digital/analog output voltage signal and outputting $(2^n-1)$ times of the reference current with a current mirror effect thereof, so as to output an output voltage for driving the display panel.

Preferably, the binary-weighted current-type digital/analog converter includes an input stage comprising n NMOS transistors controlled by the n input signals and n reference current sources respectively generating $2^0$ times of the reference current, $2^1$ times of the reference current, ..., $2^{(n-2)}$ times of the reference current and $2^{(n-1)}$ times of the reference current; a sum stage comprising a PMOS transistor summing all currents from the n reference current sources of the input stage to generate $(2^n-1)$ times of the reference current; a transfer stage comprising a PMOS transistor transferring the $(2^n-1)$ times of the reference current generated from the sum stage; and a output stage comprising a high-voltage NMOS transistor outputting the digital/analog output voltage signal based on the $(2^n-1)$ times of the reference current from the transfer stage.

Preferably, the current-mirror-type source follower includes a convert stage comprising a high-voltage NMOS transistor and a first high-voltage PMOS transistor electrically connected in series thereto, wherein the high-voltage NMOS transistor is controlled by the digital/analog output voltage signal from the binary-weighted current-type digital/analog converter to make the $(2^n-1)$ times of the reference current flow through the first high-voltage PMOS transistor; a transfer stage comprising a second high-voltage PMOS transistor and a first resistor electrically connected in series thereto, wherein the second high-voltage PMOS transistor transfers the $(2^n-1)$ times of the reference current from the convert stage to generate a preliminary voltage at the first resistor; and a buffer stage buffering the preliminary voltage from the transfer stage to generate the output voltage.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
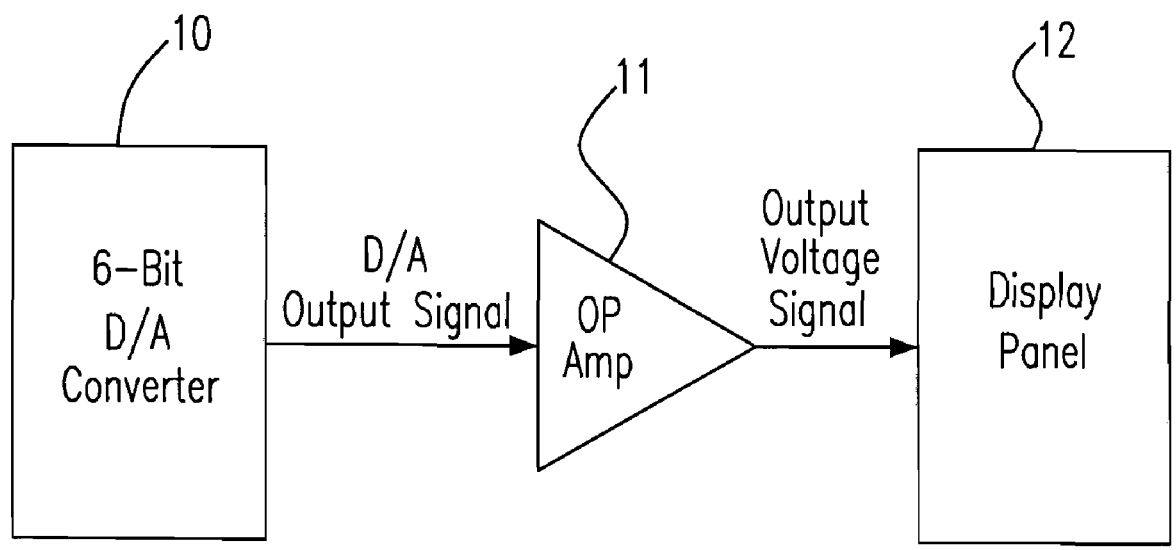
FIG. 1 is a circuit diagram showing a conventional display panel driver according to the prior art.
Figure 3:
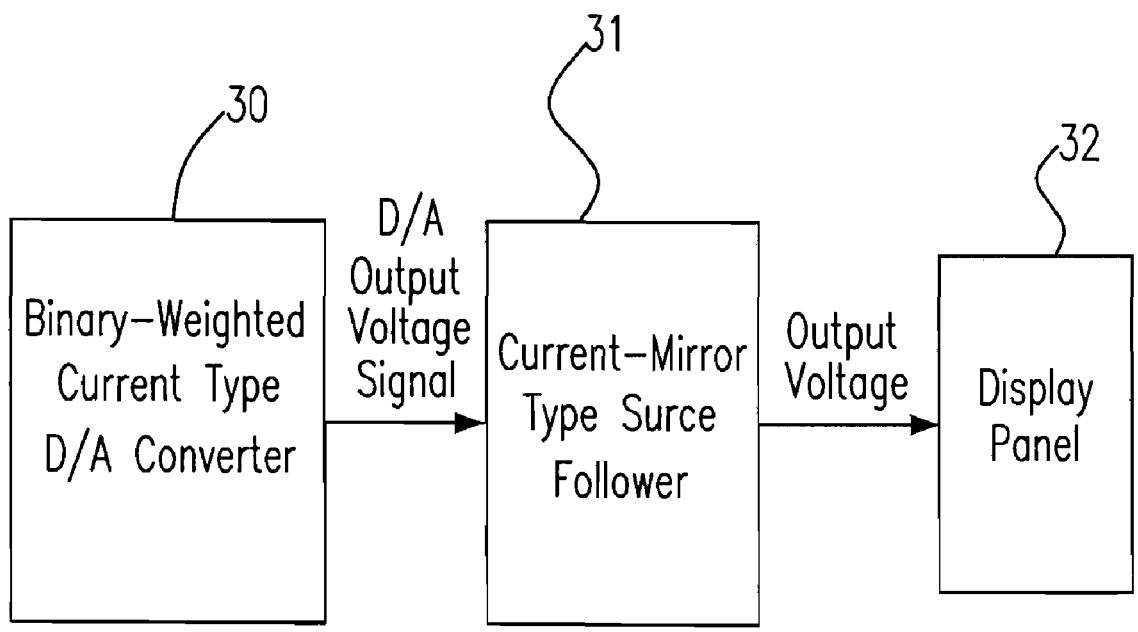
FIG. 3 is a block diagram illustrating a display panel driver according to a preferable embodiment of the present invention.

Please refer to FIG. 3, which is a block diagram illustrating a display panel driver according to a preferable embodiment of the present invention. Different from the conventional one shown in FIG. 1, the display panel driver 3 of FIG. 3 uses a binary-weighted current-type digital/analog converter 30 and a current-mirror-type source follower 31 to drive a display panel 32. A digital/analog output signal outputted from the binary-weighted current-type digital/analog converter 30 passes the current-mirror-type source follower 31 to become an output voltage for driving the display panel 32.

Since the binary-weighted current-type digital/analog converter 30 converts current to voltage with high-voltage elements, the smallest least significant bit (LSB) of the binary-weighted current-type digital/analog converter is measured in a reference current used thereby. The current-mirror-type source follower 31 transfers the total current of the binary-weighted current-type digital/analog converter 30 to the resistor of the current-mirror-type source follower 31. Since the resistor of the current-mirror-type source follower 31 is also in a high-voltage route, the LSB is the product of the amount of the reference current and the resistance of the resistor. Therefore, one LSB can be raised to about 1 V, if the power supply for the current-mirror-type source follower 31 is about 60~70 V.

Figure 4:
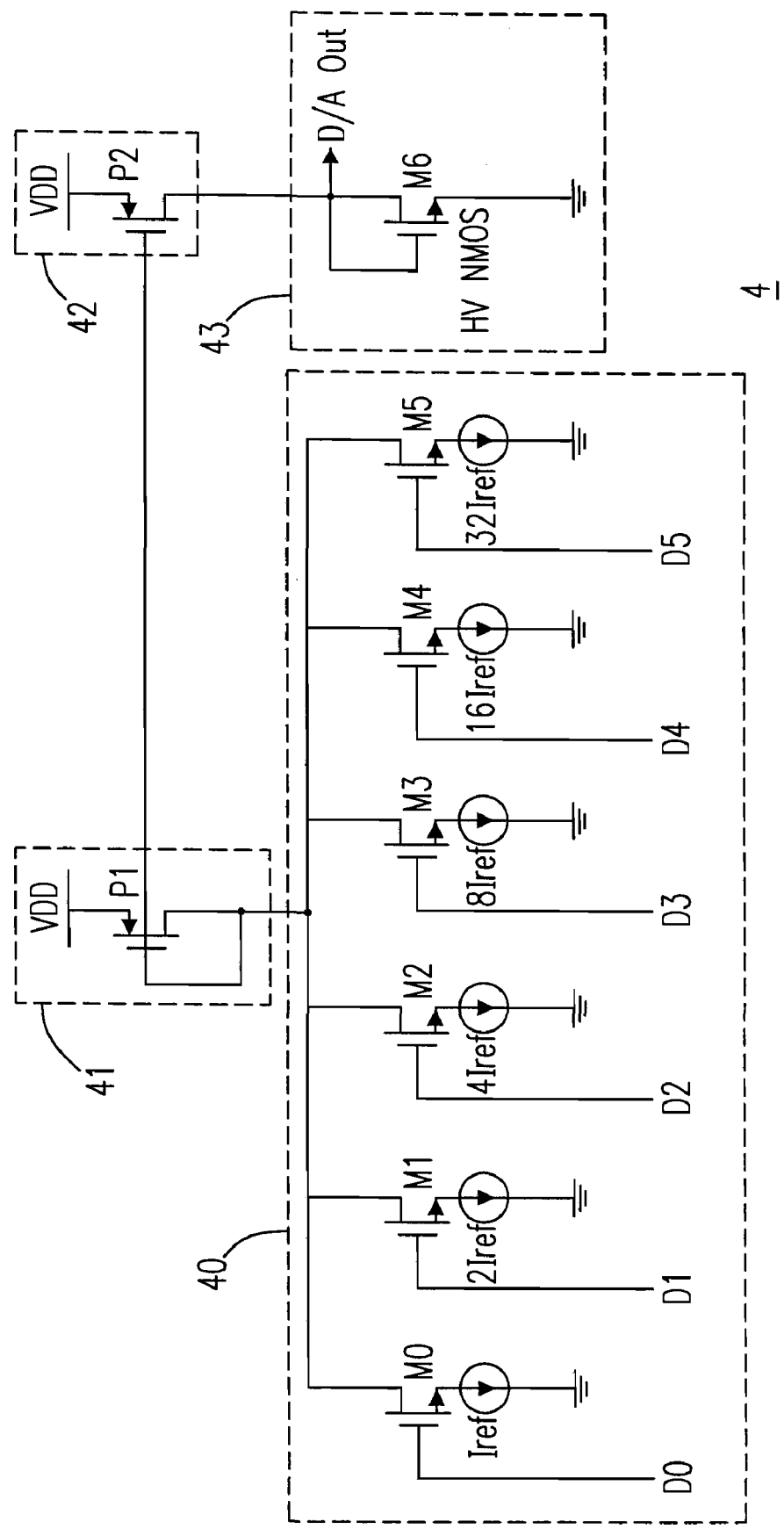
FIG. 4 is a circuit diagram illustrating a binary-weighted current-type digital/analog converter according to a preferable embodiment of the present invention.

Please refer to FIG. 4, which is a circuit diagram illustrating a binary-weighted current-type digital/analog converter according to a preferable embodiment of the present invention. The binary-weighted current-type digital/analog converter 4 includes an input stage 40, a sum stage 41, a transfer stage 42 and an output stage 43. For the convenience of the description, a 6-bit input stage 40 is adopted in the present embodiment, where 6 input signals (D0, D1, D2, D3, D4 and D5) are needed. It is achievable for those skilled in the art to generalize the practicability of an n-bit input stage.

The binary-weighted current-type digital/analog converter 4 includes 6 NMOS transistors M0~M5 and 6 reference current sources. The respective reference current sources provide reference currents $2^0$Iref, $2^1$Iref, $2^2$Iref, $2^3$Iref, $2^4$Iref and $2^5$Iref. The sum current transferred at the sum stage 41 constituted by the PMOS transistor P1 is $(2^6-1)$Iref.

After the sum current $(2^6-1)$Iref is transferred from the transfer stage 42 constituted by the PMOS transistor P2 to the output stage 43, a digital/analog output voltage signal D/A Out for the output of the binary-weighted current-type digital/analog converter 4 is formed at the source end of the high-voltage NMOS transistor M6 of the output stage 43.

Figure 5:
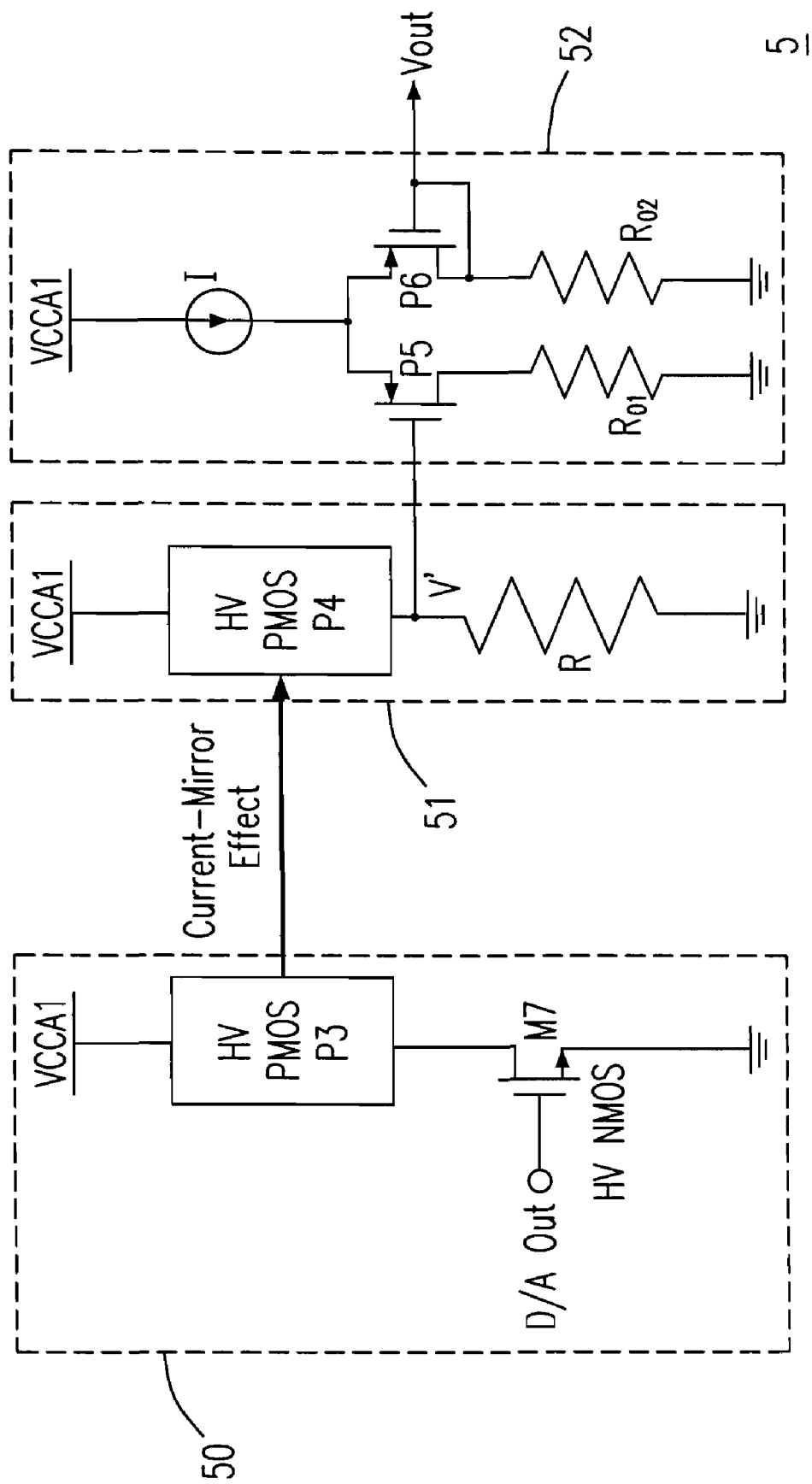
FIG. 5 is a circuit diagram illustrating a current-mirror-type source follower according to a preferable embodiment of the present invention.

Please refer to FIG. 5, which is a circuit diagram illustrating a current-mirror-type source follower according to a preferable embodiment of the present invention. The current-mirror-type source follower 50 includes a convert stage 50, a transfer stage 51 and a buffer stage 52. The convert stage 50 includes a high-voltage NMOS transistor M7 and a high-voltage PMOS transistor P3 electrically connected in series thereto. The high-voltage NMOS transistor M7 is controlled by the digital/analog output voltage signal D/A Out from the binary-weighted current-type digital/analog converter 4 to make current $(2^6-1)$Iref flow through the high-voltage PMOS transistor P3. The current $(2^6-1)$Iref is then mirrored by a current-mirror effect caused by the transfer stage 51 which includes a high-voltage PMOS transistor P4 and a resistor R. Finally, the current $(2^6-1)$Iref results in a preliminary voltage V' at the resistor R.

Figure 2:
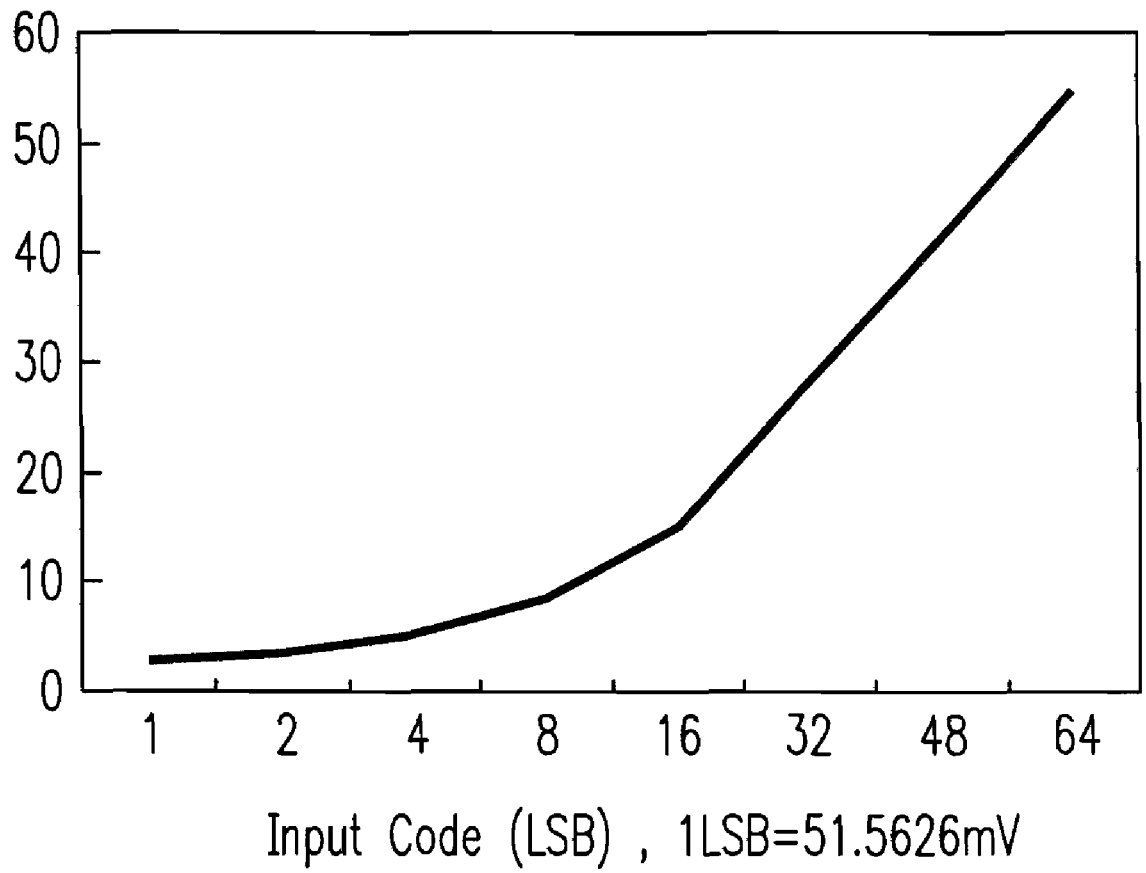
FIG. 2 is a curve diagram showing the sum of the outputs of the digital/analog converter and the output of the gain stag relating to the input code.

The buffer stage 52 includes a current source I, two PMOS transistors P5 & P6 and two resistors $R_{O1}$ & $R_{O2}$. After the preliminary voltage V' from the current-mirror-type source follower 50 is buffered by the buffer stage 52, an output voltage Vout for driving the display panel 32 of FIG. 2 is generated.

According to the above embodiments, it is clear that the display panel driver with a binary-weighted current-type digital/analog converter provided in the present invention is suitable for high speed D/A converting. Besides, since a source follower with current-mirror effect is adopted, LSB can be increased and the transistors of the source follower can be operated in saturation region. Therefore, the linearity of the buffer stage will be improved and the chip size will be reduced for the use of fewer high-voltage elements.

Figure 6:
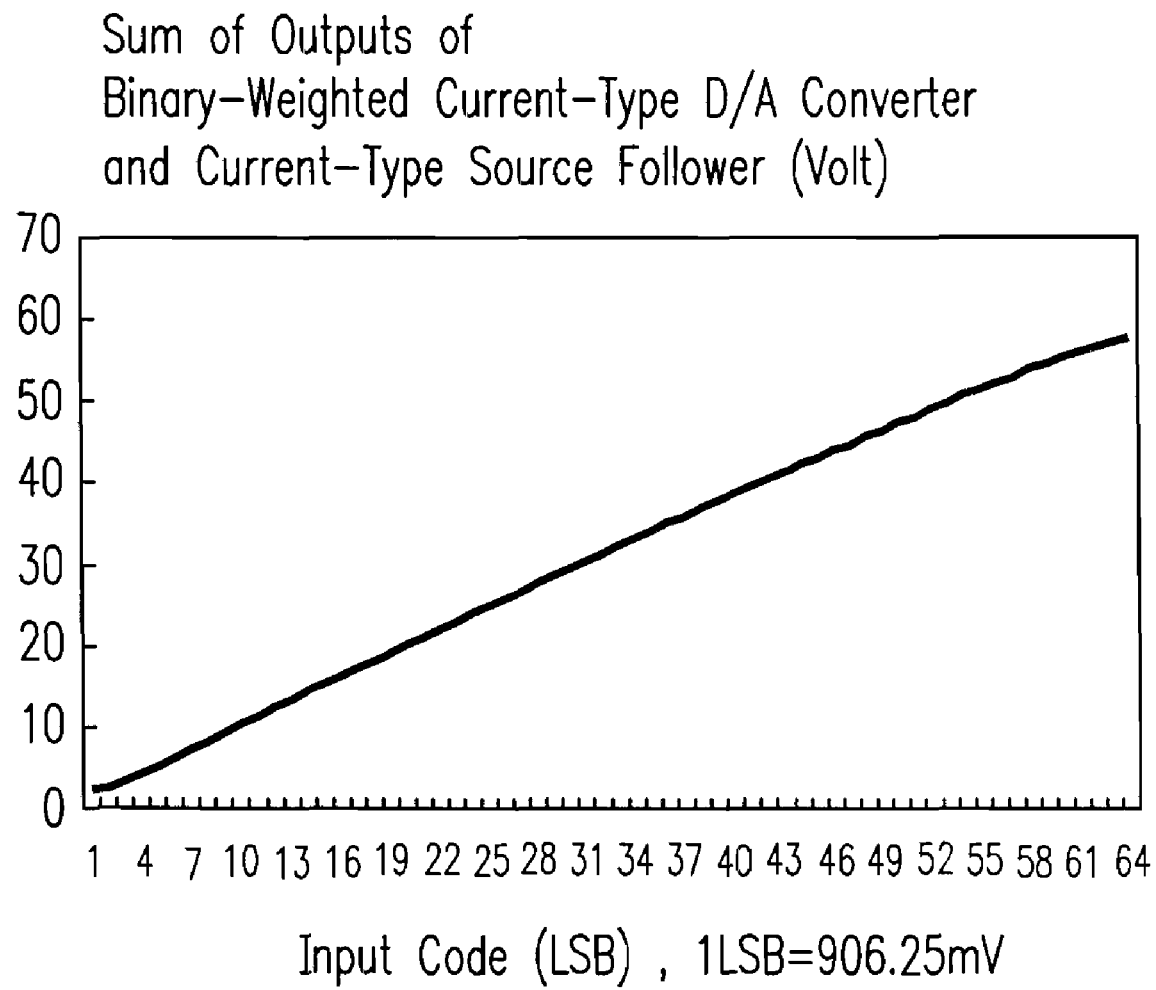
FIG. 6 is a curve diagram showing the sum of the outputs of the binary-weighted current-type digital/analog converter and the output of the current-mirror type source follower relating to the input code.

Please refer to FIG. 6, which is a curve diagram showing the sum of the outputs of the binary-weighted current-type digital/analog converter and the output of the current-mirror type source follower relating to the input code, wherein the longitudinal coordinate axis represents the sum of the output of the binary-weighted current-type digital/analog converter and the output of the current-mirror type source follower (unit: volt) and the abscissa axis represents the input code (unit: LSB). It is clear from FIG. 6 that almost all of the input codes are in the linearity region, even the range of the small voltages shown in FIG. 2.

In conclusion, the display panel driver provided in the present invention includes a binary-weighted current-type digital/analog converter and a current-mirror type source follower, which has fewer high-voltage elements and hence a better linearity. The chip size can therefore be reduced. The display panel driver of the present invention can be applied to a field emission display (FED), a vacuum fluorescent display (VFD) or an organic light emitting diode (OLED).

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A display panel driver, comprising:
   a binary-weighted current-type digital/analog converter receiving n input signals and outputting a digital/analog output voltage signal based on $(2^n-1)$ times of a reference current, the converter comprising:
   an input stage comprising n NMOS transistors controlled by the n input signals and n reference current sources respectively generating $2^0$ times of the reference current, $2^1$ times of the reference current, ..., $2^{(n-2)}$ times of the reference current and $2^{(n-1)}$ times of the reference current;
   a sum stage comprising a PMOS transistor summing all currents from the n reference current sources of the input stage to generate $(2^n-1)$ times of the reference current;
   a transfer stage comprising a PMOS transistor transferring the $(2^n-1)$ times of the reference current generated from the sum stage; and
   an output stage comprising a high-voltage NMOS transistor outputting the digital/analog output voltage signal based on the $(2^n-1)$ times of the reference current from the transfer stage; and
   a current-mirror-type source follower receiving the digital/analog output voltage signal and outputting $(2^n-1)$ times of the reference current with a current mirror effect thereof, so as to output an output voltage for driving the display panel.

2. The display panel driver as claimed in claim 1, wherein the display panel is chosen from the group consisting of a field emission display (FED), a vacuum fluorescent display (VFD) and an organic light emitting diode (OLED).

3. A display panel driver, comprising:
a binary-weighted current-type digital/analog converter receiving n input signals and outputting a digital/analog output voltage signal based on $(2^n-1)$ times of a reference current; and
a current-mirror-type source follower receiving the digital/analog output voltage signal and outputting $(2^n-1)$ times of the reference current with a current mirror effect thereof, so as to output an output voltage for driving the display panel, and comprising:
  a convert stage comprising a high-voltage NMOS transistor and a first high-voltage PMOS transistor electrically connected in series thereto, wherein the high-voltage NMOS transistor is controlled by the digital/analog output voltage signal from the binary-weighted current-type digital/analog converter to make the $(2^n-1)$ times of the reference current flow through the first high-voltage PMOS transistor;
  a transfer stage comprising a second high-voltage PMOS transistor and a first resistor electrically connected in series thereto, wherein the second high-voltage PMOS transistor transfers the $(2^n-1)$ times of the reference current from the convert stage to generate a preliminary voltage at the first resistor; and
  a buffer stage buffering the preliminary voltage from the transfer stage to generate the output voltage.

4. The display panel driver as claimed in claim 3, wherein the buffer stage comprises:
  a current source having an output end;
  a first PMOS transistor having a source end, a drain end electrically connected to the output end of the current source, and a gate end receiving the preliminary voltage;
  a second resistor having one end electrically connected to the source end of the first PMOS transistor and the other end electrically connected to ground;
  a second PMOS transistor having a source end, a drain end electrically connected to the output end of the current source, and a gate end electrically connected to the source end thereof to generate the output voltage; and
a third resistor having one end electrically connected to the source end of the second PMOS transistor and the other end electrically connected to ground.

\* \* \* \* \*